United States Patent
Suzuki

(10) Patent No.: US 7,348,109 B2
(45) Date of Patent: Mar. 25, 2008

(54) RETICLE, SEMICONDUCTOR DIE AND METHOD OF MANUFACTURING SEMICONDUCTOR DEVICE

(75) Inventor: Hiroyuki Suzuki, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/808,269

(22) Filed: Jun. 7, 2007

(65) Prior Publication Data

US 2007/0287078 A1    Dec. 13, 2007

(30) Foreign Application Priority Data

Jun. 9, 2006    (JP) .............................. 2006-161375

(51) Int. Cl.
*G03F 9/00*    (2006.01)
(52) U.S. Cl. .............................. 430/5; 430/22; 430/30; 430/312; 438/14; 438/18; 438/401; 716/19
(58) Field of Classification Search .................... 430/5, 430/22, 30, 312; 438/14, 18, 401; 716/19
See application file for complete search history.

(56) References Cited

U.S. PATENT DOCUMENTS 6,492,189 B1 *  12/2002  Yamaguchi ................. 438/18
7,207,028 B2 *  4/2007  Inoue .......................... 716/19
7,219,422 B2 *  5/2007  Wada et al. ................... 29/842

FOREIGN PATENT DOCUMENTS

JP    2005-283609 A    10/2005

* cited by examiner

Primary Examiner—Christopher G. Young
(74) Attorney, Agent, or Firm—Morrison & Foerster LLP

(57) ABSTRACT

The invention is directed to increasing the number of semiconductor dice obtained from one semiconductor wafer and enhancing the reliability and yield of the semiconductor dice when the semiconductor dice as products and TEG dice are formed on the semiconductor wafer. TEG die pattern regions are respectively placed on the top and bottom placing a plurality of semiconductor die pattern regions regularly arrayed in a longitudinal direction therebetween. The vertical length of each of the TEG die pattern regions is substantially half of the vertical length of the semiconductor die pattern region. With this reticle, two adjacent TEG die patterns respectively formed by two continuous exposure processes form the area of one semiconductor die pattern. In this manner, the area of the TEG die patterns on the semiconductor wafer is reduced and the yield of the semiconductor dice is increased correspondingly.

6 Claims, 3 Drawing Sheets

RETICLE, SEMICONDUCTOR DIE AND METHOD OF MANUFACTURING SEMICONDUCTOR DEVICE

CROSS-REFERENCE OF THE INVENTION

This application claims priority from Japanese Patent Application No. 2006-161375, the content of which is incorporated herein by reference in its entirety.

BACKGROUND OF THE INVENTION

1. Field of the Invention

The invention relates to a reticle, particularly to a reticle used for obtaining both semiconductor dice as products and TEG (Test Element Group) dice. The invention also relates to a semiconductor die obtained with the reticle and a method of manufacturing a semiconductor device with the reticle.

2. Description of the Related Art

In an exposure process for transferring a desired pattern onto a semiconductor wafer, a photomask called a reticle is generally used. A reticle formed with a pattern which is about four or five times larger than an actual pattern is used in a stepper (a reduction projection exposure system), and through this reticle ultraviolet light or excimer laser light is applied to a semiconductor wafer to transfer a reduced desired pattern thereon.

Some reticles are provided with TEG (Test Element Group) die pattern regions as well as semiconductor die pattern regions as actual products. A TEG die is a sample for evaluating the element structures, property, electric property, circuit operation, reliability and yield of products (semiconductor dice).

A conventional reticle having semiconductor die pattern regions and TEG die pattern regions will be described referring to figures. FIG. 3 is a schematic plan view of a conventional reticle 100.

This reticle 100 provides six semiconductor dice at one shot. A substrate 101 made of quartz is formed with six semiconductor die pattern regions 102 which are to be actual products and two TEG die pattern regions 103 placing the semiconductor die pattern regions 102 therebetween. The semiconductor die pattern regions 102 and the TEG die pattern regions 103 have the same shapes (almost rectangular shapes) in a plan view and the same sizes.

Dicing line regions 104 are formed between the adjacent semiconductor die pattern regions 102 and between the semiconductor die pattern regions 102 and the TEG die pattern regions 103.

TEG patterns transferred onto a semiconductor wafer with this reticle 100 are used for evaluating the property of the semiconductor dice on the wafer and not needed after the evaluation. Therefore, the TEG dice are cut out in a dicing process as well as the semiconductor dice, and removed. The relevant technique is described in Japanese Patent Application Publication No. 2005-283609, for example.

For obtaining semiconductor dice as products as many as possible from the limited area of a semiconductor wafer, there has been an increasing demand for minimizing the area of the TEG dice.

With the described conventional reticle, however, the area of the two TEG die pattern regions 103 which are not needed eventually makes the yield of the semiconductor dice low. Although it is possible to form only one TEG die pattern region 103 on the reticle to increase the yield, this causes reduction of the reliability of semiconductor dice as products since elements are not sufficiently evaluated.

Alternatively, it is also proposed that TEG die patterns are formed in dicing line regions on a semiconductor wafer instead of surrounding the TEG dice by the dicing line regions 104 as described above. However, this causes various metal materials (e.g. aluminum wiring or an electrode) formed in the TEG dice to scatter by contact of a blade in a dicing process, and the scattering metal materials are likely to adhere semiconductor dice. This also causes a problem of reducing the reliability and yield of these semiconductor dice. Furthermore, when metal pieces are left in the dicing line regions, the yields of some products may be reduced when the semiconductor die is mounted on a circuit board or the like.

The invention is directed to providing a reticle that realizes sufficient evaluation of elements with TEG dice and increases the number of semiconductor dice obtained from one semiconductor wafer. Furthermore, the invention is directed to enhancing the reliability and yield of the semiconductor dice.

SUMMARY OF THE INVENTION

The invention is directed to solving the above problems and the feature of the invention is as follows. The invention provides a reticle including: a plurality of semiconductor die pattern regions regularly arrayed in a direction; and TEG die pattern regions placing the plurality of semiconductor die pattern regions therebetween, wherein a total length of the TEG die pattern regions in the direction is substantially equal to a length of the semiconductor die pattern region in the direction.

In the reticle of the invention, a length of the TEG die pattern region in the direction is substantially half of the length of the semiconductor die pattern region in the direction.

In the reticle of the invention, the TEG die pattern region has an alignment measuring region for preventing misalignment between the reticle and a semiconductor wafer, and is formed so that the alignment measuring region is placed in four corners of the reticle for one shot.

In the reticle of the invention, the TEG die pattern region has a line width measuring region, and is formed so that the line width measuring region is placed in four corners of the reticle for one shot.

The invention also provides a semiconductor die obtained by dicing a semiconductor wafer where semiconductor die patterns and TEG die patterns are transferred with the reticle of the invention.

The invention also provides a method of manufacturing a semiconductor device including: a first exposure process transferring a semiconductor die pattern and a TEG die pattern onto a semiconductor wafer with the reticle of the invention; and a second exposure process transferring a semiconductor die pattern and a TEG die pattern onto the semiconductor wafer with the reticle, wherein the second exposure process is performed by controlling alignment between one side of the TEG die pattern transferred by the first exposure process and one side of the TEG die pattern transferred by the second exposure process.

In the method of the invention, a dicing line is not formed through the TEG die pattern and individual semiconductor dice are obtained from the semiconductor wafer by dicing at regular intervals.

DETAILED DESCRIPTION OF THE INVENTION

Figure 1:
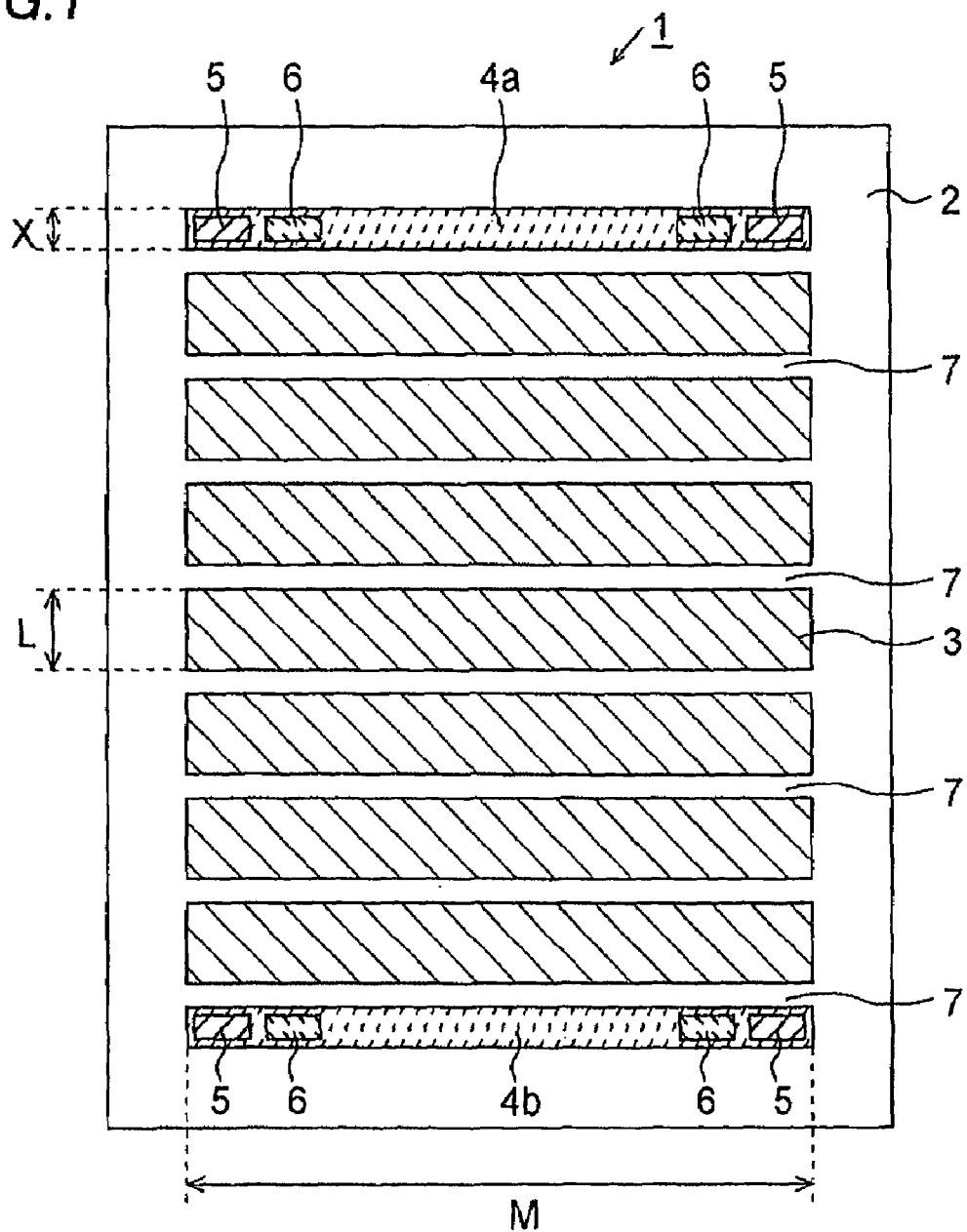
FIG. 1 is a plan view for explaining a reticle of an embodiment of the invention.

An embodiment of the invention will be described referring to figures. FIG. 1 is a schematic plan view of a reticle of the embodiment.

This reticle 1 provides seven semiconductor die patterns at one shot, for example. Seven semiconductor die pattern regions 3 are regularly formed in a substrate 2 made of quartz in a longitudinal direction in FIG. 1, for example. The semiconductor die pattern regions 3 are almost rectangular in a plan view respectively and have the same sizes. The vertical length of the semiconductor die pattern region 3 is L. A number of element patterns for a transistor, wiring, a contact hole or the like is formed in the semiconductor die pattern region 3.

Two TEG die pattern regions 4a and 4b are formed placing the plurality of semiconductor die pattern regions 3 therebetween. Placing the plurality of TEG die pattern regions on the top and bottom in this manner enhances the accuracy of evaluation with TEG dice.

A group of evaluation elements such as, for example, a transistor property evaluation pattern, a contact hole resistance evaluation pattern or the like is formed as a test pattern in the TEG die pattern regions 4a and 4b. A pattern corresponding to an electrode portion (not shown) is further formed in the TEG die pattern regions 4a and 4b. This realizes electrical connection between the TEG die and an external measuring device through an electrode portion in order to measure the electric property of the TEG die.

An alignment measuring region 5 and a line width measuring region 6 are formed in positions corresponding to the four corners of the reticle 1. The alignment measuring region 5 is a region formed with a mark or the like as an index for evaluating whether or not the reticle 1 and a semiconductor wafer are aligned properly in an exposure process. The line width measuring region 6 is a region for measuring a line width (wiring width) in each position and comparing the measured values to detect the inclination of the semiconductor wafer (or the inclination of a stage) in the exposure process and prevent a defect. It is preferable to place the alignment measuring region 5 and the line width measuring region 6 in the four corners of the reticle for one shot in this manner for enhancing the reliability of the evaluation with the TEG dice.

Each of the TEG die pattern regions 4a and 4b is formed to have a vertical length X which is substantially half of the vertical length L of one semiconductor die pattern region 3. The lateral length of each of the TEG die pattern regions 4a and 4b is M which is equal to the lateral length of the semiconductor die pattern region 3. Therefore, the total size of the combined TEG die pattern regions 4a and 4b is the same as the size of one semiconductor die pattern region 3.

Dicing line regions 7 are formed between the adjacent semiconductor die pattern regions 3 and between the semiconductor die pattern regions 3 and the TEG die pattern regions 4a and 4b.

Figure 2:
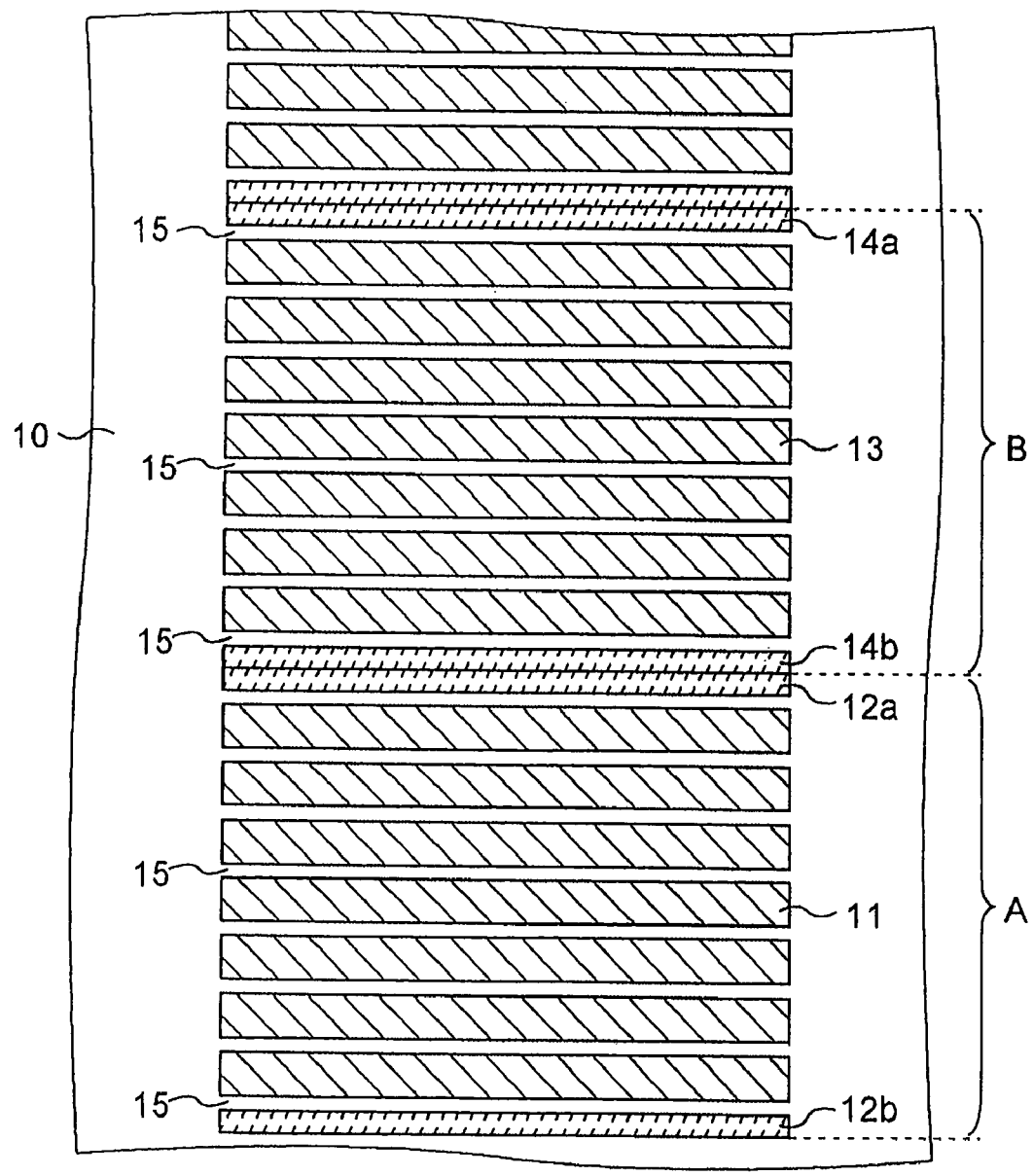
FIG. 2 is a plan view for explaining the reticle, a semiconductor die and a method of manufacturing a semiconductor device of the embodiment of the invention.
Figure 3:
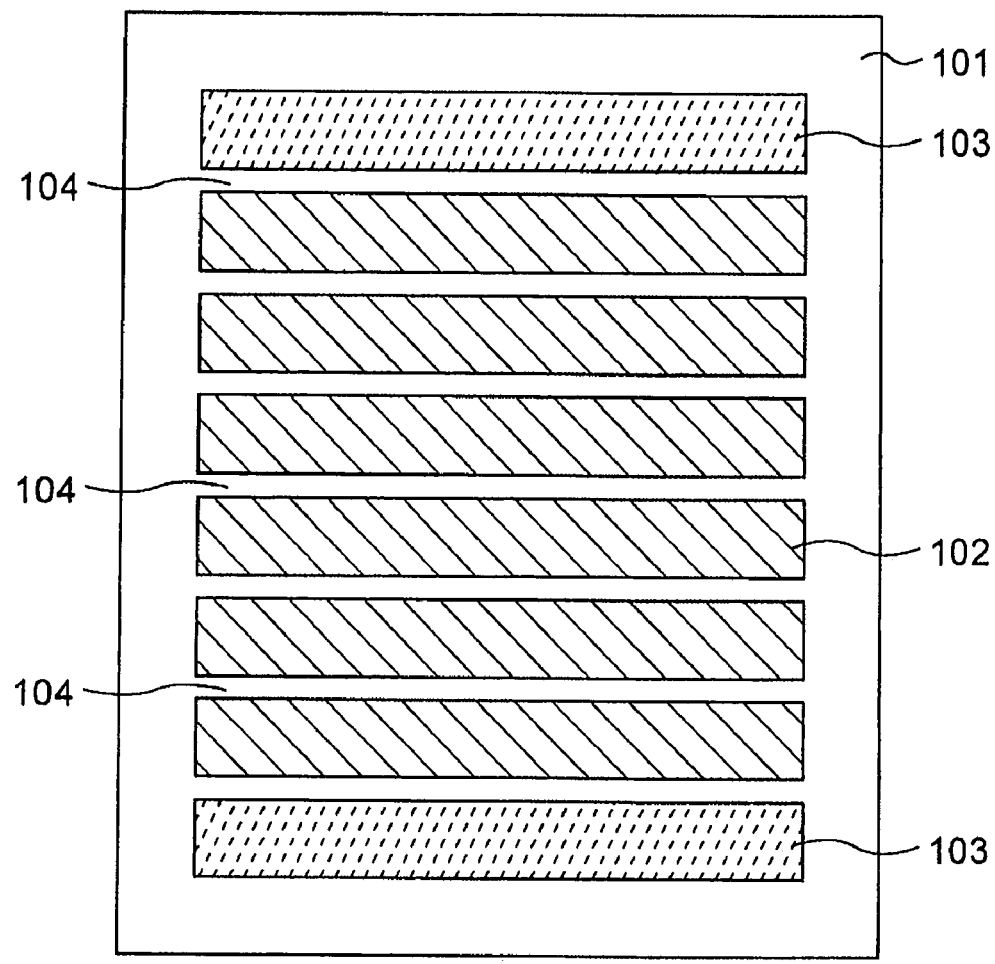
FIG. 3 is a plan view for explaining a conventional reticle.

Next, a description will be given on processes from transferring semiconductor die patterns and TEG die patterns onto a semiconductor wafer with the reticle 1 of this embodiment (the exposure process) to dicing the wafer into individual semiconductor dice referring to FIG. 2.

A resist film (not shown) is coated on a semiconductor wafer 10 and exposure is performed to the resist film with the reticle 1 to transfer semiconductor die patterns 11 corresponding to the semiconductor die pattern regions 3 and TEG die patterns 12a and 12b corresponding to the TEG die pattern regions 4a and 4b onto the resist film on the semiconductor wafer 10 (a first exposure process). The patterns formed by this first exposure process are shown by A in FIG. 2.

Then, in the similar manner to the described first exposure process, semiconductor die patterns 13 corresponding to the semiconductor die pattern regions 3 and TEG die patterns 14a and 14b corresponding to the TEG die pattern regions 4a and 4b are formed in the area next to the pattern A (a second exposure process). The patterns formed by this second exposure process are shown by B in FIG. 2. This second exposure process is performed by controlling alignment between the reticle 1 and the semiconductor wafer 10 so that one side of the TEG die pattern 12a formed by the first exposure process first and one side of the TEG die pattern 14b transferred by the second exposure process contact each other. That is, the two adjacent TEG die patterns respectively formed by the two continuous exposure processes form the shape and size of one semiconductor die pattern as a whole. In this embodiment, the combined two TEG die patterns 12a and 14b have substantially the same shape and size as one semiconductor die pattern 11 or 13. This realizes reduction of the region of the TEG dice formed on the semiconductor wafer, compared with the conventional one.

When exposure is completed to the whole surface of the semiconductor wafer 10 by repeating the described exposure process, development is performed thereto with a developer to form a resist pattern. Then, the semiconductor dice and the TEG dice are formed on the whole surface of the semiconductor wafer 10 by an etching process with this resist pattern.

Then, the property evaluation with the TEG dice is performed to determine the property of the semiconductor dice. The semiconductor wafer 10 is then cut along dicing lines 15 provided between the semiconductor dice and between the semiconductor dice and the TEG dice, and separated into individual semiconductor dice. Actually, dicing lines (not shown) are also provided in a direction perpendicular to the dicing lines 15, and the semiconductor wafer 10 is cut along these dicing lines, too. The TEG dice are generally removed after the cutting. In this embodiment, since the two continuous TEG dice form substantially the same shape and size as one semiconductor die, all the intervals of the dicing lines 15 are the same and the control of cutting positions in the dicing process is not complex.

The intervals of the dicing lines 15 are the same and a dicing line is not formed through the TEG die pattern. Therefore, the metal material of the TEG die does not scatter in the dicing process, and the reliability and yield of the semiconductor dice are not reduced.

Furthermore, in this embodiment, the region of the TEG dice formed on the semiconductor wafer is smaller than conventional, thereby increasing the number of semiconductor dice obtained from one semiconductor wafer correspondingly.

In this manner, the structure of this embodiment increases the yield of the semiconductor dice and achieves sufficient evaluation of elements and sufficient prevention of misalignment, enhancing the reliability and yield of the semiconductor dice.

The invention is not limited to the above embodiment and includes such modifications as to be readily apparent to those skilled in the art. For example, it is possible to form the lateral length of each of the TEG die pattern regions 4a and 4b shorter than the lateral length of the semiconductor die pattern region 3 while the vertical length X of each of the TEG die pattern regions 4a and 4b is substantially half of the vertical length L of the semiconductor die pattern region 3.

Furthermore, although the vertical length X of each of the TEG die pattern regions 4a and 4b is substantially half of the vertical length L of the semiconductor die pattern region 3 in the described embodiment, the TEG die pattern regions 4a and 4b may be differently designed as long as the total vertical length of the TEG die pattern regions 4a and 4b is substantially equal to the vertical length L of one semiconductor die pattern region. Such a design also realizes reduction of the region of the TEG die patterns compared with the conventional one and the same dicing line intervals.

Furthermore, although the plurality of semiconductor die pattern regions are arrayed in the longitudinal direction of the reticle in the described embodiment, it is possible to array the plurality of semiconductor die pattern regions in the lateral direction and place the plurality of TEG die pattern regions correspondingly.

The reticle of the invention has the smaller area of the TEG die pattern regions than conventional. Therefore, the number of semiconductor dice obtained from one semiconductor wafer (the yield) is increased. Furthermore, in the reticle of the invention, the TEG die pattern regions are formed placing the semiconductor die pattern regions therebetween. Therefore, the element evaluation is performed sufficiently while the yield is increased, enhancing the reliability and yield of the semiconductor dice.

What is claimed is:

1. A reticle comprising:
    a group of semiconductor die pattern regions that are elongated in a first direction and are juxtaposed in a second direction so that the first direction is normal to the second direction;
    a first test element group die region elongated in the first direction; and
    a second test element group die region elongated in the first direction,
    wherein the group of the semiconductor die pattern regions is disposed between the first and second test element group die regions, and
    a sum of a width of the first test element group die region in the second direction and a width of the second test element group die region in the second direction is equal to a width of one of the semiconductor die pattern regions in the second direction.

2. The reticle of claim 1, wherein the width of the first test element group die region in the second direction is half of the width of one of the semiconductor die pattern regions in the second direction.

3. The reticle of claim 1, wherein the first and second test element group die regions comprise alignment measuring regions for preventing misalignment between the reticle and a semiconductor wafer, and the alignment measuring regions are placed in four corners of the reticle.

4. The reticle of claim 1, wherein the first and second test element group die regions comprise line width measuring regions, and the line width measuring regions are placed in four corners of the reticle.

5. A method of manufacturing a semiconductor device, comprising:
    providing a reticle comprising,
        a group of semiconductor die pattern regions that are elongated in a first direction and are juxtaposed in a second direction so that the first direction is normal to the second direction,
        a first test element group die region elongated in the first direction, and
        a second test element group die region elongated in the first direction,
        wherein the group of the semiconductor die pattern regions is disposed between the first and second element group die regions, and
        a sum of a width of the first test element group die region in the second direction and a width of the second test element group die region in the second direction is equal to a width of one of the semiconductor die pattern regions in the second direction;
    performing a first exposure using the reticle to transfer patterns of the reticle onto a semiconductor wafer; and
    performing a second exposure using the reticle to transfer the patterns of the reticle onto the semiconductor wafer,
    wherein the second exposure is performed by controlling an alignment between a pattern transferred from the second test element group die region in the first exposure and a pattern transferred from the first test element group die region in the second exposure.

6. The method of claim 5, wherein a dicing line is not formed though the first and second test element group die regions, and individual semiconductor dice are obtained from the semiconductor wafer by dicing at regular intervals.

* * * * *